United States Patent
Saji

(10) Patent No.: US 10,396,758 B2
(45) Date of Patent: Aug. 27, 2019

(54) ELASTIC WAVE DEVICE, HIGH-FREQUENCY FRONT END CIRCUIT, AND COMMUNICATION APPARATUS

(71) Applicant: Murata Manufacturing Co., Ltd., Nagaokakyo-shi, Kyoto-fu (JP)

(72) Inventor: Mari Saji, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/633,882

(22) Filed: Jun. 27, 2017

(65) Prior Publication Data

US 2018/0091118 A1    Mar. 29, 2018

(30) Foreign Application Priority Data

Sep. 26, 2016    (JP) .................................. 2016-186971

(51) Int. Cl.
| | | |
|---|---|---|
| *H04B 1/10* | (2006.01) | |
| *H03H 9/64* | (2006.01) | |
| *H03H 7/38* | (2006.01) | |
| *H03H 9/02* | (2006.01) | |
| *H03H 9/145* | (2006.01) | |
| *H03H 9/72* | (2006.01) | |

(52) U.S. Cl.
CPC ............ *H03H 9/6406* (2013.01); *H03H 7/38* (2013.01); *H03H 9/02559* (2013.01); *H03H 9/14541* (2013.01); *H03H 9/14544* (2013.01); *H03H 9/725* (2013.01); *H04B 1/1036* (2013.01)

(58) Field of Classification Search
CPC .... H03H 9/6406; H03H 7/38; H03H 9/02559; H03H 9/14541; H03H 9/725; H04B 1/1036
USPC ........................................................ 455/286
See application file for complete search history.

(56) References Cited

U.S. PATENT DOCUMENTS

| | | | |
|---|---|---|---|
| 9,595,994 B2 * | 3/2017 | Yan ......................... | H04B 1/44 |
| 10,250,226 B2 * | 4/2019 | Saji ..................... | H01L 41/0477 |
| 2009/0174284 A1 * | 7/2009 | Mimura ............... | H03H 9/0222 310/313 A |
| 2013/0026881 A1 * | 1/2013 | Okamoto ............. | H03H 9/0222 310/313 C |
| 2014/0119244 A1 * | 5/2014 | Steer ...................... | H04B 1/525 370/278 |

(Continued)

FOREIGN PATENT DOCUMENTS

| | | |
|---|---|---|
| JP | 2014-187568 A | 10/2014 |
| WO | 2011/158445 A1 | 12/2011 |
| WO | 2013/080461 A1 | 6/2013 |

*Primary Examiner* — Sonny Trinh
(74) *Attorney, Agent, or Firm* — Keating & Bennett, LLP

(57) ABSTRACT

An elastic wave device includes a piezoelectric substrate that includes first and second main surfaces which face each other, an interdigital transducer electrode that is provided on the first main surface of the piezoelectric substrate and includes a first electrode layer containing molybdenum as a main component, and a dielectric film that is provided on the piezoelectric substrate and covers the interdigital transducer electrode. The piezoelectric substrate is made of lithium niobate. The dielectric film is made of silicon oxide. The elastic wave device utilizes Rayleigh waves propagating through the piezoelectric substrate. The duty ratio of the interdigital transducer electrode is equal to or more than about 0.55 and less than or equal to about 0.75.

22 Claims, 5 Drawing Sheets

(56) References Cited

U.S. PATENT DOCUMENTS

| | | | |
|---|---|---|---|
| 2014/0167881 A1* | 6/2014 | Iwasaki | H03H 9/25 |
| | | | 333/133 |
| 2014/0218129 A1 | 8/2014 | Fujiwara et al. | |
| 2014/0232239 A1* | 8/2014 | Iwasaki | H03H 9/02984 |
| | | | 310/313 C |
| 2014/0285287 A1 | 9/2014 | Komatsu et al. | |
| 2018/0337655 A1* | 11/2018 | Hamasaki | H03H 9/02834 |

* cited by examiner

ELASTIC WAVE DEVICE, HIGH-FREQUENCY FRONT END CIRCUIT, AND COMMUNICATION APPARATUS

CROSS REFERENCE TO RELATED APPLICATIONS

This application claims the benefit of priority to Japanese Patent Application No. 2016-186971 filed on Sep. 26, 2016. The entire contents of this application are hereby incorporated herein by reference.

BACKGROUND OF THE INVENTION

1. Field of the Invention

The present invention relates to an elastic wave device, a high-frequency front end circuit including the elastic wave device, and a communication apparatus.

2. Description of the Related Art

Elastic wave devices have been widely used for band pass filters for cellular phones. For example, in an elastic wave device described in Japanese Unexamined Patent Application Publication No. 2014-187568, a dielectric film is provided on a piezoelectric substrate such that the dielectric film covers an interdigital transducer (IDT) electrode. The elastic wave device utilizes Rayleigh waves. The piezoelectric substrate is a lithium niobate ($LiNbO_3$) substrate. The dielectric film is made of $SiO_2$. The interdigital transducer electrode contains molybdenum (Mo). Accordingly, the frequency-temperature characteristics are improved.

However, an inventor of the present application has first discovered a problem that in an elastic wave device utilizing Rayleigh waves and including a piezoelectric substrate made of lithium niobate, an interdigital transducer electrode containing molybdenum, and a dielectric film which covers the interdigital transducer electrode, the frequency-temperature characteristics degrade depending on the duty ratio of the dielectric film and, thus, manufacturing variations occur in the line width of an electrode finger of the interdigital transducer electrode.

If variations occur in the frequency of the elastic wave device, in a case in which a different frequency band is present near a pass band of the elastic wave device, for example, in the case of a transmission band Tx and a reception band Rx of Band 8, the variations may adversely affect the different frequency band. Therefore, desired filter characteristics may not be achieved.

SUMMARY OF THE INVENTION

Preferred embodiments of the present invention provide elastic wave devices, high-frequency front end circuits, and communication apparatuses which are able to reduce or prevent frequency variations while improving frequency-temperature characteristics.

According to a preferred embodiment of the present invention, an elastic wave device includes a piezoelectric substrate that includes a first main surface and a second main surface which face each other; an interdigital transducer electrode that is provided on the first main surface of the piezoelectric substrate and includes a first electrode layer containing molybdenum as a main component; and a dielectric film that is provided on the first main surface of the piezoelectric substrate and covers the interdigital transducer electrode. The piezoelectric substrate is made of lithium niobate. The dielectric film is made of silicon oxide. Rayleigh waves propagating through the piezoelectric substrate are utilized. A duty ratio of the interdigital transducer electrode is equal to or greater than about 0.55 and less than or equal to about 0.75.

According to a preferred embodiment of the present invention, the interdigital transducer electrode may further include a second electrode layer, and the second electrode layer may be directly or indirectly laminated on the first electrode layer and made of aluminum. In this case, the electric resistance of the interdigital transducer electrode is able to be reduced.

According to another preferred embodiment of the present invention, an elastic wave device includes an antenna terminal that is connected to an antenna; a first band pass filter that is connected to the antenna terminal, has a first pass band, and an elastic wave device according to a preferred embodiment of the present invention; and a second band pass filter that is connected to the antenna terminal and has a second pass band which is different from the first pass band. In this case, variations in isolation are able to be reduced, and therefore, a yield of the elastic wave device is improved.

According to another preferred embodiment of the present invention, a frequency interval between the first pass band and the second pass band may preferably be about 10 MHz or more, for example. In this case, variations in isolation are able to be reduced, and therefore, a yield of the elastic wave device is improved.

According to a preferred embodiment of the present invention, a high-frequency front end circuit includes an elastic wave device according to a preferred embodiment of the present invention; and a power amplifier.

According to a preferred embodiment of the present invention, a communication apparatus includes a high-frequency front end circuit configured according to a preferred embodiment of the present invention; and an RF signal processing circuit.

According to various preferred embodiments of the present invention, elastic wave devices, high-frequency front end circuits, and communication apparatuses which are capable of reducing or preventing frequency variations while improving frequency-temperature characteristics are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described in detail with reference to drawings.

Individual preferred embodiments described herein are exemplary preferred embodiments and it should be noted that partial replacement and combination of features, elements, configurations, etc. in different preferred embodiments are also possible.

Figure 1:
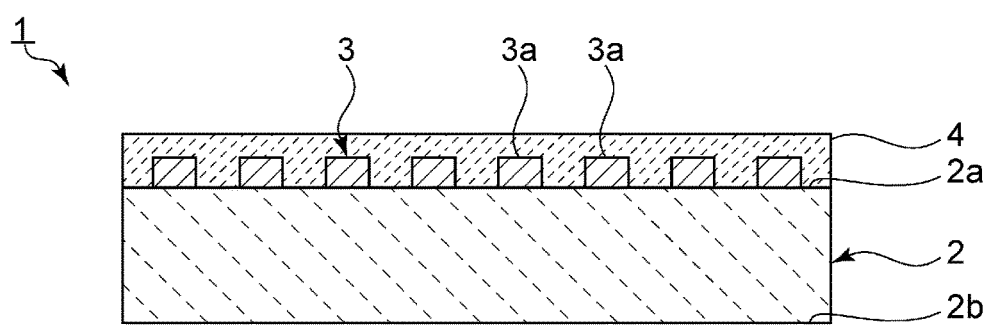
FIG. 1 is a schematic elevational cross-sectional view of an elastic wave device according to a first preferred embodiment of the present invention.

FIG. 1 is a schematic elevational cross-sectional view of an elastic wave device according to a first preferred embodiment of the present invention.

An elastic wave device 1 according to this preferred embodiment is a band pass filter, for example. As illustrated in FIG. 1, the elastic wave device 1 includes a piezoelectric substrate 2. The piezoelectric substrate 2 is preferably a Y-cut X-propagation lithium niobate substrate made of lithium niobate. In this preferred embodiment, the piezoelectric substrate 2 preferably has Euler angles ($\varphi$, $\theta$, $\psi$) of about (0°, 38°, 0°). The Euler angles ($\varphi$, $\theta$, $\psi$) of the piezoelectric substrate 2 are not limited to the above values.

The piezoelectric substrate 2 includes a first main surface 2a and a second main surface 2b, which face each other. An interdigital transducer electrode 3 is provided on the first main surface 2a. The interdigital transducer electrode 3 includes a plurality of electrode fingers 3a. When AC voltage is applied to the interdigital transducer electrode 3, elastic waves are excited. The elastic wave device 1 utilizes Rayleigh waves.

Figure 2:
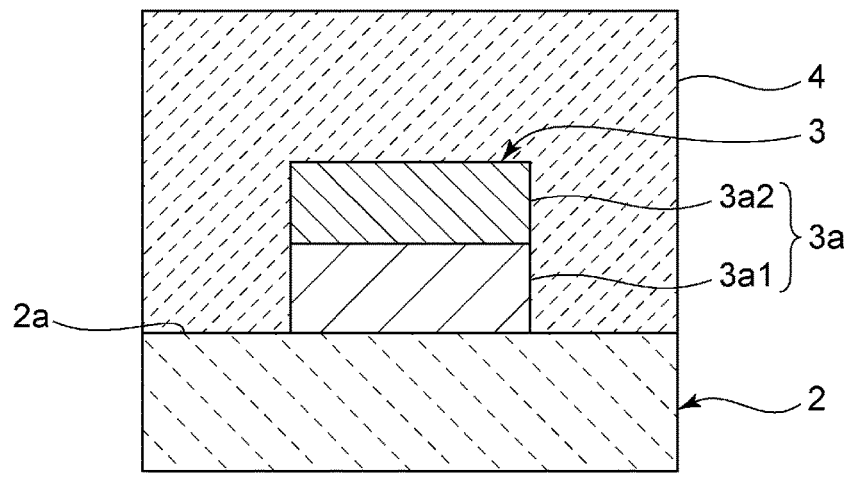
FIG. 2 is an enlarged schematic elevational cross-sectional view of an electrode finger of an interdigital transducer electrode according to the first preferred embodiment of the present invention.

FIG. 2 is an enlarged schematic elevational cross-sectional view of an electrode finger of an interdigital transducer electrode in the first preferred embodiment.

As illustrated in FIG. 2, each of the electrode fingers 3a of the interdigital transducer electrode 3 includes a first electrode layer 3a1 which is laminated on the piezoelectric substrate 2. The first electrode layer 3a1 is preferably a Mo layer containing molybdenum (Mo) as a main component. Containing Mo as a main component does not necessarily represent containing only molybdenum. Containing Mo as a main component may also represent containing an alloy which contains at least about 50 weight percent molybdenum or more, for example.

On the first electrode layer 3a1, a second electrode layer 3a2 preferably made of aluminum is laminated. The second electrode layer 3a2 may be directly laminated on the first electrode layer 3a1 or may be indirectly laminated on the first electrode layer 3a1 with a diffusion prevention layer or a joint layer interposed therebetween. Alternatively, the interdigital transducer electrode 3 may not include the second electrode layer 3a2. In the case where the interdigital transducer electrode 3 includes the second electrode layer 3a2, the electric resistance of the interdigital transducer electrode 3 is able to be reduced.

Referring back to FIG. 1, on the piezoelectric substrate 2, a dielectric film 4 covers the interdigital transducer electrode 3. The dielectric film 4 is preferably made of silicon oxide. Silicon oxide includes $Si_xO_y$, such as $SiO_2$. The elastic wave device 1 includes the dielectric film 4, and therefore, the frequency-temperature characteristics (TCV) are improved.

A wavelength defined by the electrode finger pitch of the interdigital transducer electrode 3 is denoted as $\lambda$. In this case, the film thickness of the first electrode layer 3a1 and the film thickness of the second electrode layer 3a2 illustrated in FIG. 2 are preferably, for example, about $0.007\lambda$ and about $0.005\lambda$, respectively. The film thicknesses of the first and second electrode layers 3a1 and 3a2 are not limited to the above values. The film thickness of the dielectric film 4 is not particularly limited but is preferably equal to or more than about $0.2\lambda$ and less than or equal to about $0.4\lambda$, for example. In this preferred embodiment, $\lambda$ is preferably set to about 4 µm, for example. However, the wavelength $\lambda$ is not limited to the above value.

The present preferred embodiment is based on the fact that an inventor of preferred embodiments of the present invention has first discovered a problem that in an elastic wave device utilizing Rayleigh waves and including a piezoelectric substrate made of lithium niobate, an interdigital transducer electrode containing molybdenum, and a dielectric film covering the interdigital transducer electrode, the frequency-temperature characteristics degrade depending on the duty ratio of the dielectric film, and thus, manufacturing variations occur in the line width of an electrode finger of the interdigital transducer electrode. This preferred embodiment includes a feature that Rayleigh waves propagating through the piezoelectric substrate 2 are utilized, the interdigital transducer electrode 3 includes an Mo layer, the dielectric film 4 is provided, and the duty ratio of the interdigital transducer electrode 3 is equal to or more than about 0.55 and less than or equal to about 0.75, for example. Accordingly, frequency variations are able to be reduced or prevented while the frequency-temperature characteristics are improved. Characteristics of this preferred embodiment will be described below.

A plurality of elastic wave devices having a configuration the same as or similar to that of the first preferred embodiment with different duty ratios of interdigital transducer electrodes were produced. In the first preferred embodiment, regarding an electrode finger of an interdigital transducer electrode, a line length of about 1100 nm corresponds to a duty ratio of about 0.55, and a line length of about 1500 nm corresponds to a duty ratio of about 0.75, for example. As a first comparative example, a plurality of elastic wave devices having a configuration similar to that of the first preferred embodiment with the exception that the duty ratio of an interdigital transducer electrode is less than about 0.55 or more than about 0.75 with different duty ratios were produced. Frequencies of the plurality of elastic wave devices were measured.

Figure 3:
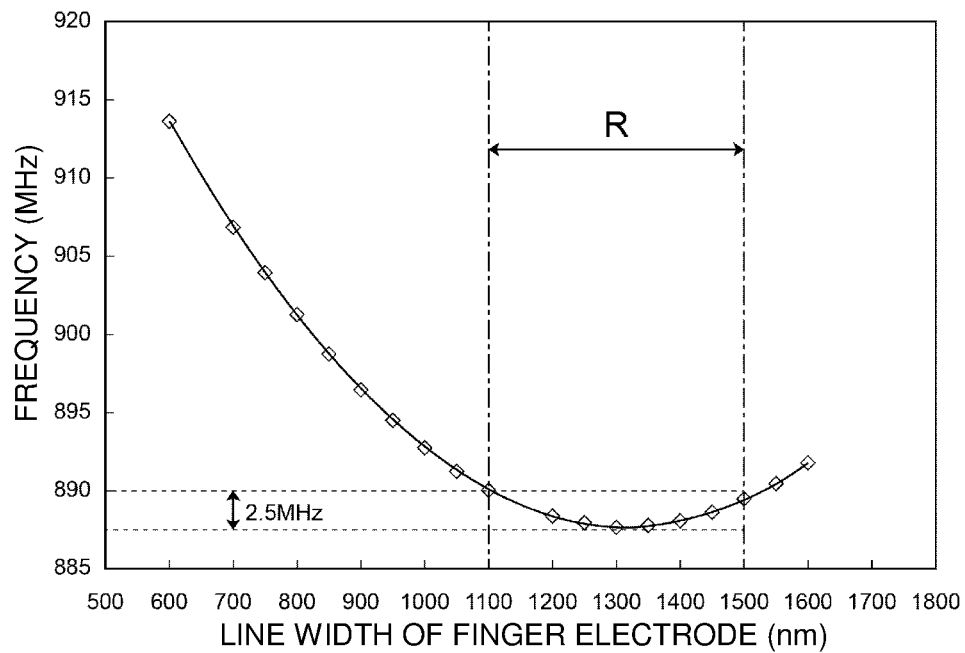
FIG. 3 is a diagram illustrating a relationship of the line width of an electrode finger of an interdigital transducer electrode and a frequency in the first preferred embodiment of the present invention and a first comparative example.

FIG. 3 is a diagram illustrating the relationship of the line length of an electrode finger of an interdigital transducer electrode and a frequency in the first preferred embodiment and the first comparative example. A range R indicated by one-dotted chain lines in FIG. 3 represents a range of the duty ratio in this preferred embodiment. The same applies to FIG. 7.

As is clear from FIG. 3, in the first comparative example, the amount of change in the frequency is larger than the amount of change in the line width of the electrode finger. For example, in the case where the line width of the electrode finger of the interdigital transducer electrode is equal to or more than about 600 nm and less than or equal to about 1050 nm, that is, in the case where the duty ratio is equal to or more than about 0.3 and less than or equal to about 0.525, the difference between the maximum frequency value and the minimum frequency value is about 22.5 MHz.

Normally, manufacturing variations occur in the line width of an electrode finger in the process of manufacturing. In the first comparative example, when the line width of an interdigital transducer electrode is shifted from a target value by about 450 nm, the frequency is shifted by about 22.5 MHz. As illustrated in FIG. 3, in the above line width range, the line width of an electrode finger and the frequency are substantially proportional to each other. Therefore, the shift of the frequency to the shift of the line width of the electrode finger is about 0.05 MHz/nm. Accordingly, with the elastic wave device according to the first comparative example, it is difficult to reduce or prevent frequency variations. Furthermore, in the case where the duty ratio is more than about 0.75, the distance between electrode fingers is short. Therefore, it is difficult to manufacture such an elastic wave device, and variations in the line width of an electrode finger also increase.

In contrast, in this preferred embodiment, the duty ratio of an interdigital transducer electrode is set to equal to or more than about 0.55 and less than or equal to about 0.75, for example. Accordingly, as illustrated in FIG. 3, the difference between the maximum frequency value and the minimum frequency value is able to be set to about 2.5 MHz, and the amount of change in the frequency is able to be reduced. The shift of the frequency to the shift of the line width of the electrode finger is about 0.01 MHz/nm, for example. Accordingly, frequency variations are able to be effectively reduced or prevented. Furthermore, in this preferred embodiment, the duty ratio is set to about 0.75 or less. Therefore, manufacturing variations in the line width of an electrode finger are also reduced.

The difference between the maximum frequency value and the minimum frequency value may be set to about 2.5 MHz or less. Therefore, in the case where the elastic wave device according to this preferred embodiment is applied to a duplexer, variations in the frequency characteristics are able to be reduced or prevented. Consequently, the yield of a duplexer or a surface acoustic wave device including a duplexer may be improved. Explanation will be provided below with an example in which the elastic wave device according to this preferred embodiment is applied to a Band 26 duplexer.

The above-described duplexer includes a first band pass filter with a first pass band and a second band pass filter having a second pass band, which is different from the first pass band. The first pass band preferably is a transmission band of Band 26 and is equal to or more than about 814 MHz and less than or equal to about 849 MHz, for example. The second pass band preferably is a reception band of Band 26 and is equal to or more than about 859 MHz and less than or equal to about 894 MHz, for example. In the explanation provided below, the elastic wave device according to this preferred embodiment is applied to first and second band pass filters.

The frequency interval between pass bands of Band 26 is about 10 MHz and frequency standards are strict. The frequency interval between pass bands represents a difference between the frequency at an end portion of a pass band of one band pass filter near a pass band of the other band pass filter and the frequency at the end portion of the pass band of the other band pass filter near the pass band of the one band pass filter. That is, in FIG. 4, the frequency interval between the frequency indicated by a broken line A and the frequency indicated by a broken line B represents the frequency interval between pass bands of the duplexer. To manufacture a Band 26 duplexer, it is preferable to reduce the total sum of the steepness of filters, frequency variations caused by a temperature change, and frequency variations in the process of manufacturing to about 10 MHz or less, for example.

Figure 4:
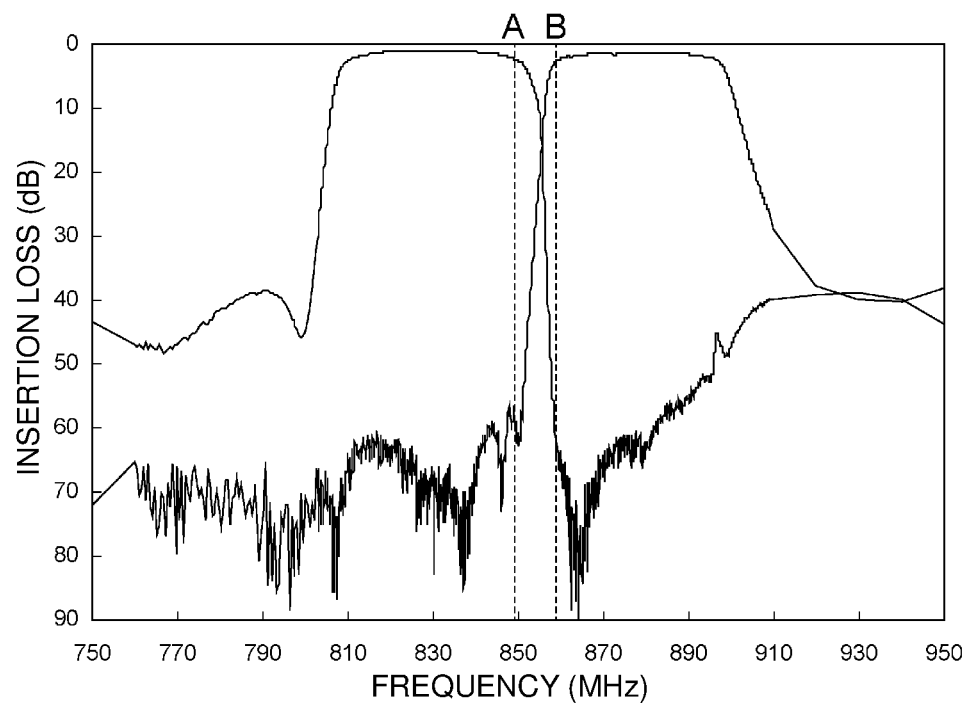
FIG. 4 is a diagram illustrating the attenuation-frequency characteristics in an example of a duplexer including the elastic wave device according to the first preferred embodiment of the present invention.

FIG. 4 is a diagram illustrating attenuation-frequency characteristics in the example of the duplexer including the elastic wave device according to the first preferred embodiment. The broken line A indicates the frequency at an end portion of a first pass band near a second pass band. The broken line B indicates the frequency at an end portion of the second pass band near the first pass band.

The difference between the frequency at an end portion of a pass band of one band pass filter near a pass band of the other band pass filter and the frequency at which the isolation between the band pass filters is about −50 dB is represented by steepness. In the duplexer described above, the frequency at the end portion of the first pass band near the second pass band preferably is about 849 MHz, and the frequency at which the isolation between the first band pass filter and the second band pass filter is about −50 dB is about 852 MHz, for example. Therefore, the steepness of the first band pass filter is about 3 MHz, for example.

For example, frequency variations caused by a temperature change are about 1 MHz. Frequency variations by a temperature change occur in each of the first band pass filter and the second band pass filter. Therefore, the frequency variations caused by a temperature change are represented by about 1 MHz×2.

When frequency variations caused by manufacturing variations in the line width of an electrode finger of each of the first band pass filter and the second band pass filter are represented by X MHz, it is preferable to satisfy equation (1) to manufacture a Band 26 duplexer.

10 MHz≥3 MHz (steepness)+1 MHz (frequency variations caused by temperature change)×2+X MHz (frequency variations in the process of manufacturing)×2    (1)

With the first and second band pass filters having the configuration according to the first preferred embodiment of the present invention, frequency variations X based on the line width of an electrode finger are able to be reduced to about 2.5 MHz or less, and bands with a frequency interval of about 10 MHz or more are able to be manufactured with excellent yield.

Figure 5:
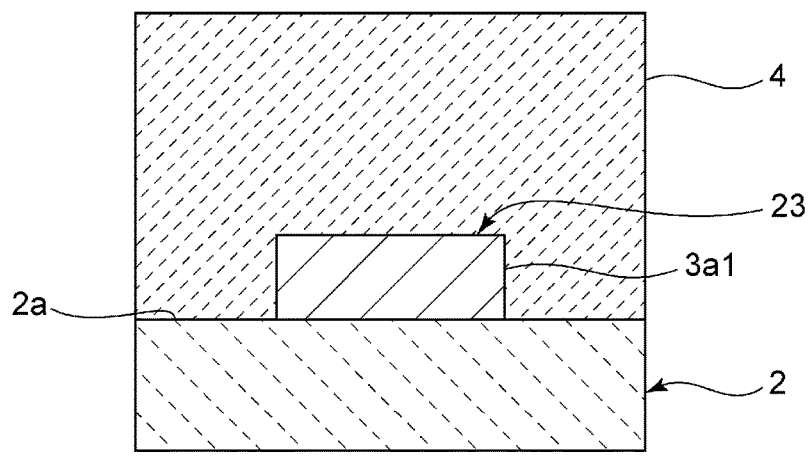
FIG. 5 is an enlarged schematic elevational cross-sectional view of an electrode finger of an interdigital transducer electrode in a first variation of the first preferred embodiment of the present invention.

As in the first variation of the first preferred embodiment illustrated in FIG. 5, an interdigital transducer electrode 23 may not include a second electrode layer.

Figure 6:
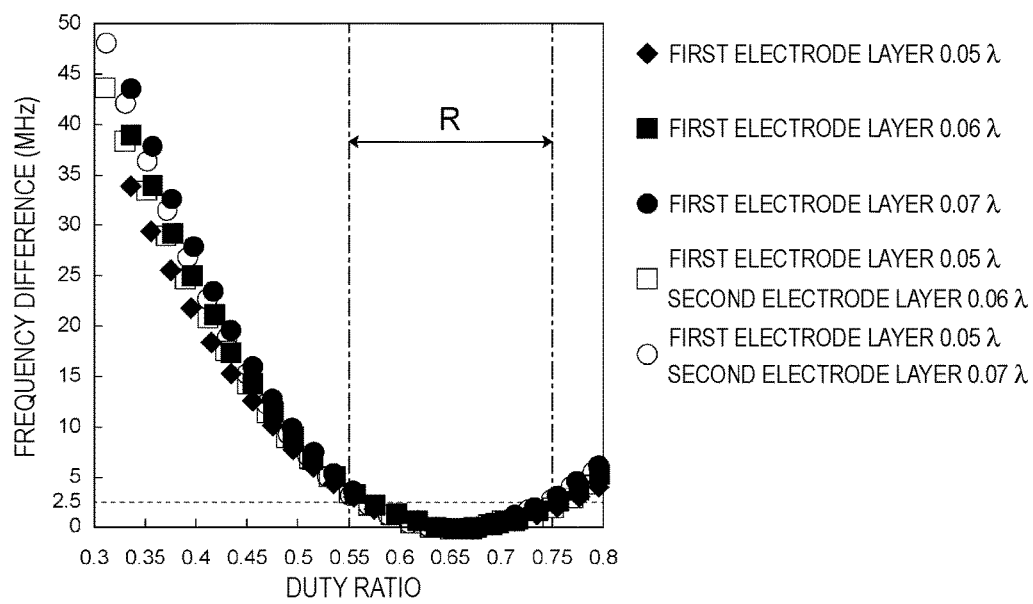
FIG. 6 is a diagram illustrating the relationship of the film thickness, duty ratio, and frequency difference of an electrode finger of an interdigital transducer electrode in the first preferred embodiment of the present invention and the first variation.

FIG. 6 is a diagram illustrating the relationship of the film thickness, duty ratio, and frequency difference of an electrode finger of an interdigital transducer electrode in the first preferred embodiment and the first variation. A frequency difference on the vertical axis in FIG. 6 represents a difference between the minimum frequency value and a frequency at each duty ratio.

In FIG. 6, plots indicated by white squares and white circles represent results of cases where an interdigital transducer electrode includes first and second electrode layers. The plot indicated by white squares represents a result of a case where the film thickness of the first electrode layer is about 0.05 λ and the film thickness of the second electrode layer is about 0.06 λ, for example. The plot indicated by white circles represents a result of a case where the film thickness of the first electrode layer is about 0.05 λ and the film thickness of the second electrode layer is about 0.07 λ, for example. Plots indicated by black diamonds, black squares, and black circles represent results of cases where an interdigital transducer electrode includes a first electrode layer but does not include a second electrode layer. The plot indicated by the black diamonds represents a result of a case where the film thickness of the first electrode layer is about 0.05 λ, for example. The plot indicated by the black squares represents a result of a case where the film thickness of the first electrode layer is about 0.06 λ, for example. The plot indicated by the black circles represents a result of a case where the film thickness of the first electrode layer is about 0.07 λ, for example.

In FIG. 6, the plots indicated by the white squares and the white circles with a duty ratio of about 0.55 or more and 0.75 or less represent results in the first preferred embodiment. The plots indicated by the black diamonds, the black squares, and the black circles with a duty ratio of about 0.55 or more and about 0.75 or less represent results in the first variation.

As illustrated in FIG. 6, in the first variation, in any case where the film thickness of the first electrode layer is changed, a frequency difference of about 2.5 MHz or less is able to be achieved, as in the first preferred embodiment. Accordingly, also in the first variation, frequency variations are able to be reduced or prevented. As is clear from FIG. 6, also in the case where the film thickness of the second electrode layer is changed in the first preferred embodiment, frequency variations are able to be reduced or prevented.

On the dielectric film 4 illustrated in FIG. 1, another dielectric film may be provided. The dielectric film is not particularly limited. However, the dielectric film may preferably be made of, for example, silicon nitride. Silicon nitride is, for example, SiN. In this case, the dielectric film may be used as a frequency adjusting film.

The dielectric film 4 may preferably be formed by, for example, sputtering. In sputtering, a protruding portion may be formed at a position where the dielectric film 4 and an electrode finger 3a of the interdigital transducer electrode 3 overlap in a plan view. The dielectric film 4 may include such a protruding portion arranged on a surface opposite the interdigital transducer electrode 3. In this case, it is preferable that the film thickness of the dielectric film 4 should be set such that influence of the protruding portion is sufficiently small.

In this preferred embodiment, the film thickness of the dielectric film 4 is preferably equal to or more than about 0.2 λ and less than or equal to about 0.4 λ, for example. Also with the film thickness outside the above range, the frequency-temperature characteristics are able to be improved, and frequency variations are able to be effectively reduced or prevented.

Now, a second comparative example in which an interdigital transducer electrode is made of a metal different from molybdenum will be compared with the first preferred embodiment. The second comparative example has a configuration similar to that of the first preferred embodiment with the exception that an interdigital transducer electrode is made of Cu.

Figure 7:
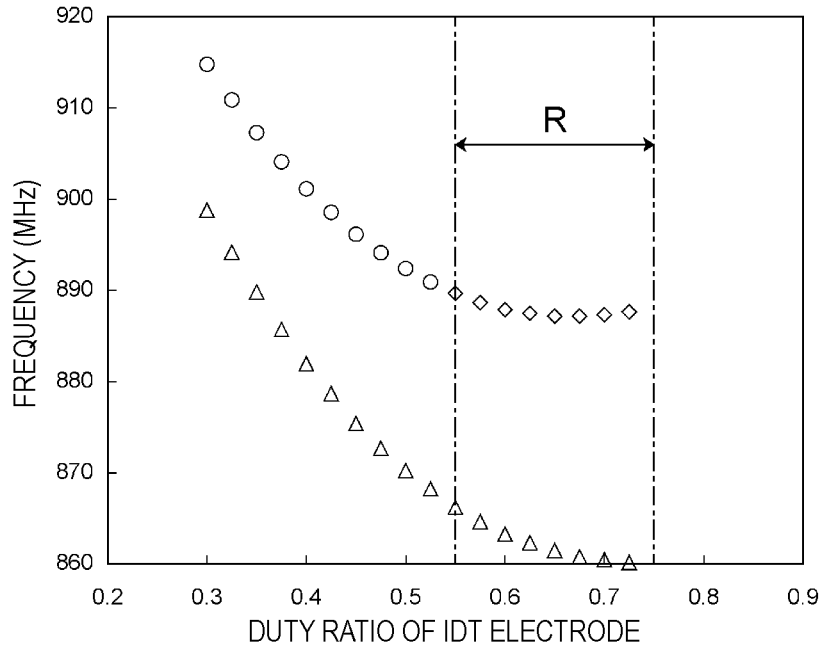
FIG. 7 is a diagram illustrating the relationship of the duty ratio and frequency of an interdigital transducer electrode in an elastic wave device in the first preferred embodiment of the present invention, the first comparative example, and a second comparative example.

FIG. 7 is a diagram illustrating the relationship of the duty ratio and frequency of an interdigital transducer electrode in an elastic wave device according to the first preferred embodiment and the first and second comparative examples. In FIG. 7, a plot indicated by diamonds represents a result in the first preferred embodiment, a plot indicated by circles represents a result in the first comparative example, and a plot indicated by triangles represents a result in the second comparative example.

As is clear from FIG. 7, in the first preferred embodiment, the amount of change in the frequency is smaller than the amount of change in the line width of an electrode finger of an interdigital transducer electrode, compared to the second comparative example. Accordingly, in the first preferred embodiment, with an electrode finger including a first electrode layer as a Mo layer, frequency variations are able to be effectively reduced. In addition, in the first preferred embodiment, the frequency has a minimum value. Therefore, frequency variations are able to be further reduced.

The elastic wave device according to the first preferred embodiment preferably is a band pass filer. However, an elastic wave device according to a preferred embodiment of the present invention may also be applied to a duplexer or a multiplexer. This will be specifically explained below.

Figure 8:
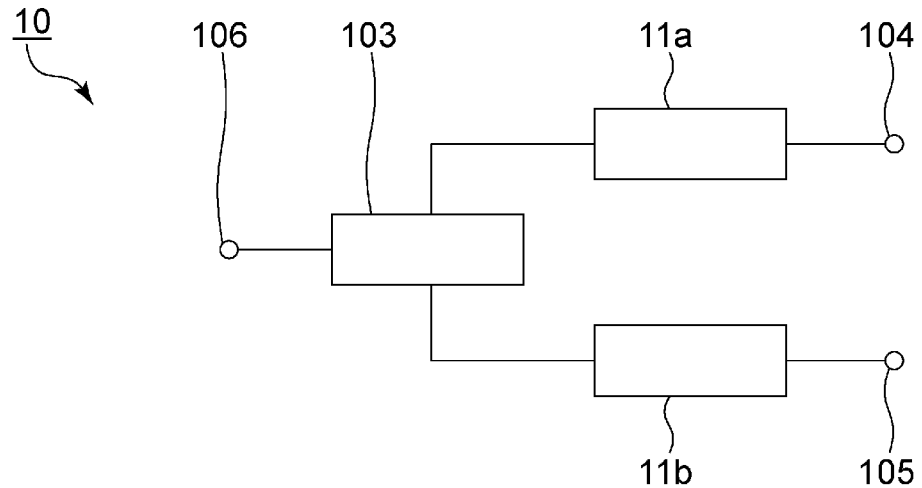
FIG. 8 is a schematic circuit diagram of an elastic wave device according to a second preferred embodiment of the present invention.

FIG. 8 is a schematic circuit diagram of an elastic wave device according to a second preferred embodiment of the present invention.

An elastic wave device 10 according to the second preferred embodiment preferably is a duplexer, for example. The elastic wave device 10 includes first to third terminals 104 to 106. The third terminal 106 is an antenna terminal connected to an antenna. The elastic wave device 10 includes a first band pass filter 11a to which the first terminal 104 is connected, a second band pass filter 11b to which the second terminal 105 is connected, and a matching circuit 103 to which the third terminal 106 is connected.

In the elastic wave device 10, the first and second band pass filters 11a and 11b are indirectly connected to the third terminal 106 with the matching circuit 103 interposed therebetween. The arrangement of the matching circuit 103 in the elastic wave device 10 is not particularly limited. The elastic wave device 10 does not necessarily include the matching circuit 103 as an element of the elastic wave device 10. The first and second band pass filters 11a and 11b may be directly connected to the third terminal 106 without any element interposed therebetween.

A band pass filter having a configuration of the above-described elastic wave device may be a reception filter or a transmission filter.

The first band pass filter 11a has a first pass band. More specifically, the first pass band is preferably a transmission band of Band 26 and is equal to or more than about 814 MHz and less than or equal to about 849 MHz, for example. The second band pass filter 11b has a second pass band, which is different from the first pass band. More specifically, the second pass band is preferably a reception band of Band 26 and is equal to or more than about 859 MHz and less than or equal to about 894 MHz, for example.

The first and second band pass filters 11a and 11b each preferably have the same or substantially the same configuration as the first preferred embodiment, and the duty ratio of an interdigital transducer electrode is equal to or more than about 0.55 and less than or equal to about 0.75, for example. Accordingly, as illustrated in FIG. 3 or FIG. 6, in equation (1), X may be set to about 2.5 MHz or less, for example. Therefore, equation (1) is satisfied. Consequently, frequency variations are able to be reduced or prevented, and variations in the isolation are able to be reduced. Furthermore, as in the first preferred embodiment, the band pass filters each include the dielectric film, and therefore, the frequency-temperature characteristics are also improved.

Pass bands of the first and second band pass filters are not limited to the above. An elastic wave device according to a preferred embodiment of the present invention may preferably be a duplexer of a communication band with a narrow frequency interval between pass bands, such as Band 8, for example. For Band 8, preferably, the transmission band is equal to or more than about 880 MHz and less than or equal to about 915 MHz, and the reception band is equal to or more than about 925 MHz and less than or equal to about 960 MHz. Therefore, the difference in the frequency between the pass bands is about 10 MHz, for example. However, an elastic wave device according to a preferred embodiment of the present invention may be a duplexer of a communication band with a frequency interval between pass bands of more than about 10 MHz, for example. With an elastic wave device according to a preferred embodiment of the present invention, in the case where the frequency interval between pass bands is about 10 MHz or more, variations in the isolation are able to be further reliably reduced.

Figure 9:
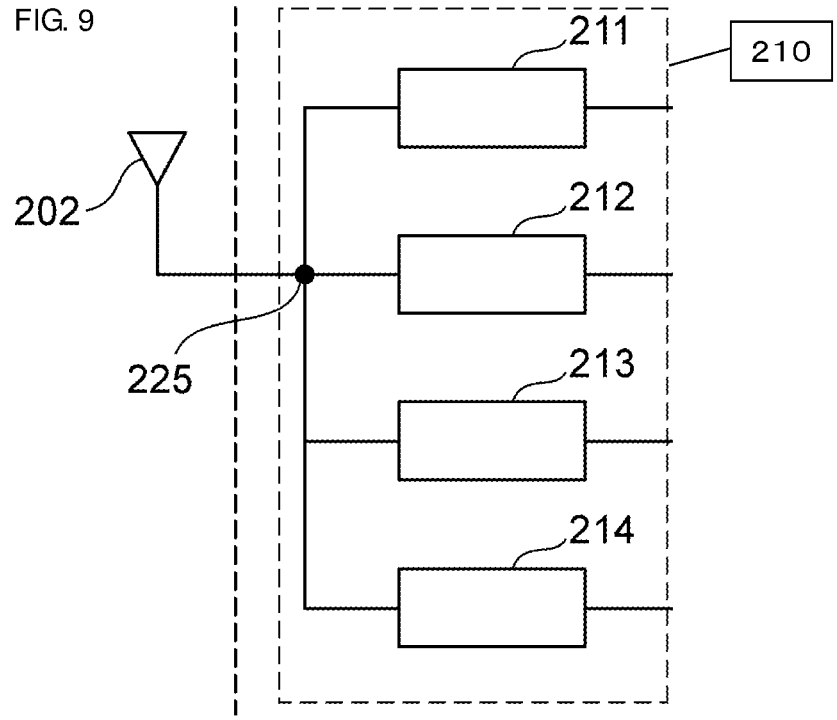
FIG. 9 is a schematic diagram of an elastic wave device according to a third preferred embodiment of the present invention.

FIG. 9 is a configuration diagram of an elastic wave device according to a third preferred embodiment of the present invention.

An elastic wave device 210 according to the third preferred embodiment preferably is a multiplexer, for example. The elastic wave device 210 includes an antenna common terminal 225. The antenna common terminal 225 is an antenna terminal connected to an antenna 202. The elastic wave device 210 includes a plurality of band pass filters 211, 212, 213, and 214, which are connected to the antenna common terminal 225. At least one of the plurality of band pass filters 211, 212, 213, and 214 has a configuration similar to that in the first preferred embodiment. Therefore, frequency variations are able to be reduced or prevented and variations in the isolation are able to be reduced while the frequency-temperature characteristics are improved. An elastic wave device as the above multiplexer may include the configuration in the second preferred embodiment. Specifically, the first band pass filter 11a and the second band pass filter 11b may be any of the plurality of band pass filters 211, 212, 213, and 214.

An elastic wave device according to a preferred embodiment of the present invention may be used, for example, for a high-frequency front end circuit or a communication apparatus. This example will be described below.

Figure 10:
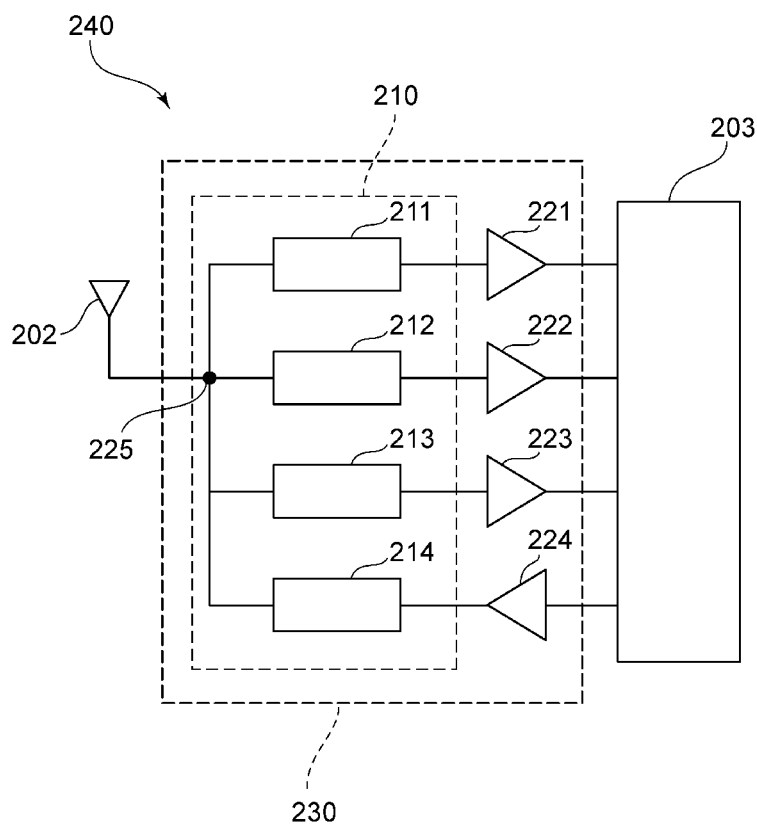
FIG. 10 is a schematic diagram of a communication apparatus including a high-frequency front end circuit.

FIG. 10 is a schematic configuration diagram of a communication apparatus including a high-frequency front end circuit. A communication apparatus 240 includes an antenna 202, a high-frequency front end circuit 230, and an RF signal processing circuit 203. The high-frequency front end circuit 230 is a circuit component connected to the antenna 202. The high-frequency front end circuit 230 includes a multiplexer 210 and amplifiers 221 to 224. The multiplexer 210 includes first to fourth filters 211 to 214.

The multiplexer 210 includes an antenna common terminal 225 connected to the antenna 202. First ends of the first to third filers 211 to 213 as reception filters and a first end of the fourth filter 214 as a transmission filter are connected in common to the antenna common terminal 225.

Output ends of the first to third filters 211 to 213 are connected to the amplifiers 221 to 223, respectively. The amplifier 224 is connected to an input end of the fourth filter 214. Output ends of the amplifiers 221 to 223 are connected to the RF signal processing circuit 203. An input end of the amplifier 224 is connected to the RF signal processing circuit 203.

An elastic wave device according to a preferred embodiment of the present invention may be applied to at least one of the first to fourth filters 211 to 214. Furthermore, an elastic wave device according to a preferred embodiment of the present invention may be applied to the multiplexer 210. Furthermore, an elastic wave device according to a preferred embodiment of the present invention may be applied to a duplexer, instead of the multiplexer 210. The multiplexer 210 may include only a plurality of transmission filters or only a plurality of reception filters.

Elastic wave devices, high-frequency front end circuits, and communication apparatuses according to preferred embodiments of the present invention and variations have been described above. However, other preferred embodiments including a combination of component elements in the foregoing preferred embodiments or variations, variations obtained by making various modifications conceived by those skilled in the art to the foregoing preferred embodiments without departing from the scope of the present invention, various types of equipment including a high-frequency front end circuit and a communication apparatus according to a preferred embodiment of the present invention are also included in the present invention.

Preferred embodiments of the present invention are widely usable for communication equipment, such as a cellular phone, as a filter, a duplexer, a multiplexer, a high-front end circuit, and a communication apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   an antenna terminal that is connected to an antenna;
   a first band pass filter that is connected to the antenna terminal and has a first pass band;
   a second band pass filter that is connected to the antenna terminal and has a second pass band which is different from the first pass band; and
   a matching circuit that is connected to the antenna terminal; wherein
   the first and second band pass filters are indirectly connected to the antenna terminal with the matching circuit interposed and connected between the antenna terminal and the first and second band pass filters;
   each of the first band pass filter and the second band pass filter includes:
      a piezoelectric substrate that includes a first main surface and a second main surface which face each other;
      an interdigital transducer electrode that is provided on the first main surface of the piezoelectric substrate and includes a first electrode layer containing molybdenum as a main component; and
      a dielectric film that is provided on the first main surface of the piezoelectric substrate and covers the interdigital transducer electrode; wherein
      the piezoelectric substrate is made of lithium niobate;

the dielectric film is made of silicon oxide;
the elastic wave device has a structure that causes Rayleigh waves to propagate through the piezoelectric substrate; and
a duty ratio of the interdigital transducer electrode is equal to or more than about 0.55 and less than or equal to about 0.75; and
a frequency interval between the first pass band and the second pass band is about 10 MHz or more.

2. The elastic wave device according to claim 1, wherein
at least one of the interdigital transducer electrode of the first band pass filter and the interdigital transducer electrode of the second band pass filter further includes a second electrode layer; and
the second electrode layer is directly or indirectly laminated on the first electrode layer and is made of aluminum.

3. The elastic wave device according to claim 2, wherein the second electrode layer is directly laminated on the first electrode layer.

4. The elastic wave device according to claim 2, wherein the second electrode layer is indirectly laminated on the first electrode layer with a diffusion prevention layer or a joint layer interposed therebetween.

5. The elastic wave device according to claim 2, wherein a film thickness of the first electrode layer and a film thickness of the second electrode layer are about 0.007 λ and about 0.005 λ, respectively, where a wavelength defined by an electrode finger pitch of the interdigital transducer electrode is denoted as λ.

6. The elastic wave device according to claim 1, wherein at least one of the piezoelectric substrate of the first band pass filter and the piezoelectric substrate of the second band pass filter has Euler angles (φ, θ, ψ) of about (0°, 38°, 0°).

7. The elastic wave device according to claim 1, wherein at least one of the dielectric film of the first band pass filter and the dielectric film of the second band pass filter is made of $SiO_2$.

8. A high-frequency front end circuit comprising:
the elastic wave device according to claim 1; and
a power amplifier.

9. A communication apparatus comprising:
the high-frequency front end circuit according to claim 8; and
an RF signal processing circuit.

10. The elastic wave device according to claim 1, wherein the elastic wave device is a duplexer.

11. The elastic wave device according to claim 1, wherein the elastic wave device is a multiplexer.

12. The elastic wave device according to claim 10, wherein the first pass band is a transmission band and the second pass band is a reception band.

13. The elastic wave device according to claim 12, wherein the first pass band is equal to or more than about 814 MHz and less than or equal to about 849 MHz, and the second pass band is equal to or more than about 859 MHz and less than or equal to about 894 MHz.

14. An elastic wave device comprising:
an antenna terminal that is connected to an antenna;
a first band pass filter that is connected to the antenna terminal and has a first pass band; and
a second band pass filter that is connected to the antenna terminal and has a second pass band which is different from the first pass band; wherein
the first band pass filter includes:
a piezoelectric substrate that includes a first main surface and a second main surface which face each other;
an interdigital transducer electrode that is provided on the first main surface of the piezoelectric substrate and includes a first electrode layer containing molybdenum as a main component; and
a dielectric film that is provided on the first main surface of the piezoelectric substrate and covers the interdigital transducer electrode; wherein
the piezoelectric substrate is made of lithium niobate;
the dielectric film is made of silicon oxide;
the elastic wave device has a structure that causes Rayleigh waves to propagate through the piezoelectric substrate; and
a duty ratio of the interdigital transducer electrode is equal to or more than about 0.55 and less than or equal to about 0.75; and
the first pass band is equal to or more than about 814 MHz and less than or equal to about 849 MHz, and the second pass band is equal to or more than about 859 MHz and less than or equal to about 894 MHz.

15. The elastic wave device according to claim 14, wherein a frequency interval between the first pass band and the second pass band is about 10 MHz or more.

16. The elastic wave device according to claim 14, wherein the first pass band is a transmission band and the second pass band is a reception band.

17. The elastic wave device according to claim 14, further comprising a matching circuit connected to the antenna terminal.

18. The elastic wave device according to claim 17, wherein the first and second band pass filters are indirectly connected to the antenna terminal with the matching circuit interposed therebetween.

19. The elastic wave device according to claim 14, wherein the elastic wave device is a duplexer.

20. The elastic wave device according to claim 14, wherein the elastic wave device is a multiplexer.

21. A high-frequency front end circuit comprising:
the elastic wave device according to claim 14; and
a power amplifier.

22. A communication apparatus comprising:
the high-frequency front end circuit according to claim 21; and
an RF signal processing circuit.

* * * * *